United States Patent
Kim et al.

(10) Patent No.: US 7,848,155 B2
(45) Date of Patent: Dec. 7, 2010

(54) NON-VOLATILE MEMORY SYSTEM INCLUDING SPARE ARRAY AND METHOD OF ERASING A BLOCK IN THE SAME

(75) Inventors: Doo Gon Kim, Gyeonggi-do (KR); Ki Tae Park, Gyeonggi-do (KR); Yeong Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 266 days.

(21) Appl. No.: 12/165,861

(22) Filed: Jul. 1, 2008

(65) Prior Publication Data

US 2009/0010073 A1 Jan. 8, 2009

(30) Foreign Application Priority Data

Jul. 2, 2007 (KR) .................. 10-2007-0066076

(51) Int. Cl.
*G11C 11/34* (2006.01)
*G11C 16/04* (2006.01)
(52) U.S. Cl. .............................. 365/185.29; 365/185.09
(58) Field of Classification Search ............ 365/185.29, 365/185.09, 185.33
See application file for complete search history.

(56) References Cited

U.S. PATENT DOCUMENTS

| | | | |
|---|---|---|---|
| 6,078,525 A * | 6/2000 | Kuriyama et al. ...... | 365/185.24 |
| 6,134,140 A | 10/2000 | Tanaka et al. | |
| 6,680,868 B2 | 1/2004 | Akamatsu | |
| 6,906,961 B2 | 6/2005 | Eggleston et al. | |
| 6,992,937 B2 * | 1/2006 | Tran et al. ................... | 365/200 |
| 7,085,161 B2 | 8/2006 | Chen et al. | |
| 7,116,592 B2 * | 10/2006 | Takeda et al. ............... | 365/200 |
| 2004/0015674 A1 * | 1/2004 | Lakhani et al. ............. | 711/206 |

* cited by examiner

*Primary Examiner*—Anh Phung
(74) *Attorney, Agent, or Firm*—Myers Bigel Sibley & Sajovec

(57) ABSTRACT

Methods of operating non-volatile memory devices can compensate for threshold voltage disturbances caused by overhead data programming during block erase operations. These methods include erasing a spare array of nonvolatile memory cells and a corresponding main array of nonvolatile memory cells that shares word lines with the spare array. This erasing operation is followed by writing updated overhead data (e.g., an erase count) into the spare array and then performing a soft program operation. This soft program operation is performed on at least a first portion of the main array to thereby narrow a threshold voltage distribution of erased memory cells within the first portion of the main array. The soft program operation is then followed by an operation to verify an erased status of at least the first portion of the main array and an operation to communicate that the main and spare arrays of nonvolatile memory cells have been properly erased to a memory controller.

15 Claims, 8 Drawing Sheets

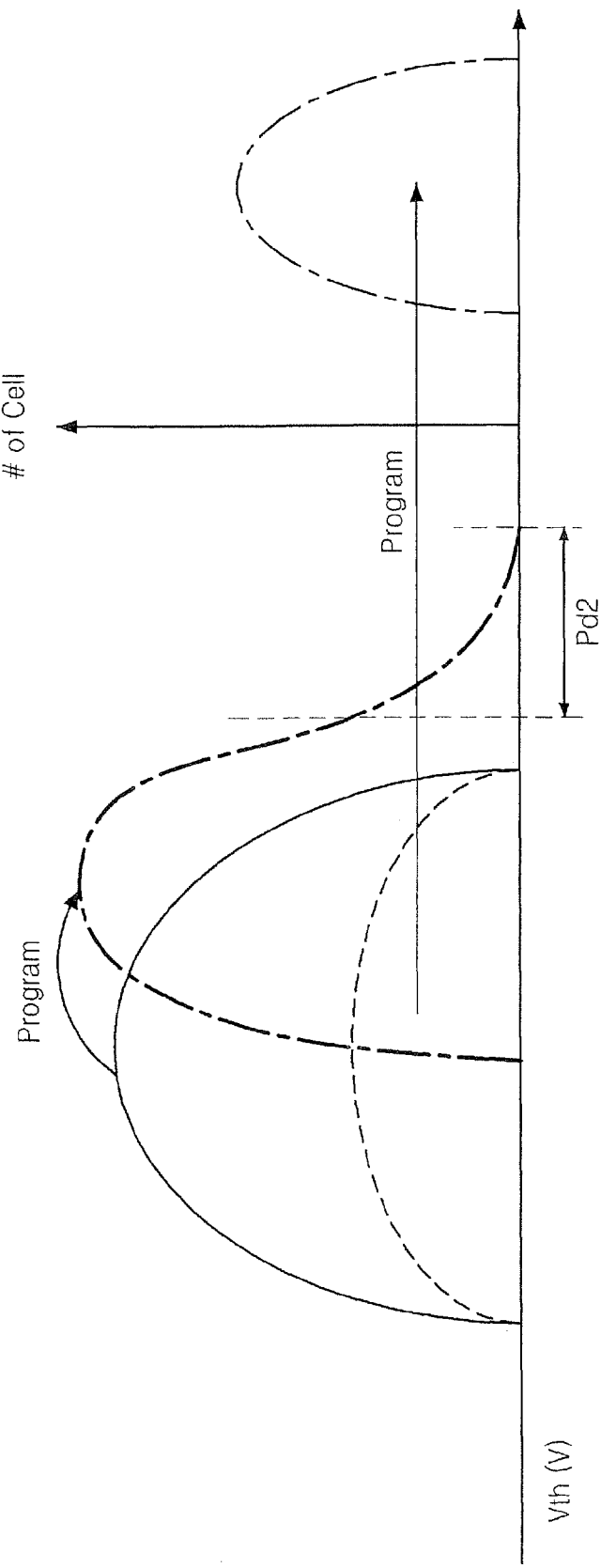

NON-VOLATILE MEMORY SYSTEM INCLUDING SPARE ARRAY AND METHOD OF ERASING A BLOCK IN THE SAME

CROSS-REFERENCE TO RELATED PATENT APPLICATION

This application claims the benefit of Korean Patent Application No. 10-2007-0066076, filed on Jul. 2, 2007, in the Korean Intellectual Property Office, the disclosure of which is incorporated herein in its entirety by reference.

FIELD OF THE INVENTION

The present invention relates to the field of non-volatile memory technology, and more particularly, to a non-volatile memory system including a spare array and a method of erasing a block in the memory system.

BACKGROUND OF THE INVENTION

Non-volatile memory systems like flash memory systems are widely used in compact electronic devices (e.g., digital cameras, digital camcorders, and digital music players) having a data storing function due to their compact size and re-programming ability. The number of program and erase operations may be restricted with respect to a flash memory cell array included in a non-volatile memory system, and more specifically, in a flash memory system. Since an insulation layer of cells included in the memory cell array is thin, the insulation layer may be worn away when the program and erase operations are repeated.

The abrasion state of cells may vary with how many times the cells have been programmed. For instance, some cells may be far more worn away than other cells. At this time, the cells that are badly worn away may degrade the entire performance of the flash memory system. In other words, when the number of cells badly worn away reaches a threshold value, the flash memory system may be recognized unusable even if other usable cells exist.

In order to increase the probability that cells in a flash memory system are uniformly worn away, methods of managing the number of erases (hereinafter, referred to as an erase count) by blocks in units of which cells are erased and uniformly using the blocks based on the erase count have been suggested. In flash memory systems, usually, a program operation is performed in units of cells, but an erase operation is performed in units of blocks including a plurality of cells. Accordingly, the erase count is managed by blocks.

One of those methods is disclosed in U.S. Pat. No. 7,085,161 in which the erase count is stored in spare bytes. Here, the spare bytes are included in memory cell arrays to replace bad bytes in a space for user data. FIG. 1 shows an example of a conventional logical structure of a memory cell array 10 including a spare array 13. Referring to FIG. 1, the memory cell array 10 includes a plurality of pages (P0, P1, ..., PN) and each of the pages (P0, P1, ..., PN) includes a main array 11 for storing user data and header information and the spare array 13 for replacing bad bytes in a space for the user data. Memory cells adjacent to the spare array 13 in the main array 11 are influenced by a program voltage when data is recorded in the spare array 13 and program inhibition cannot be perfectly achieved. Accordingly, the memory cells adjacent to the spare array 13 are easily subjected to program disturbance.

FIG. 2 is a flowchart of a conventional method of erasing a block in a non-volatile memory device. FIG. 2 is the drawing attached to U.S. Pat. No. 7,085,161 in order to explain a process of erasing data stored in a memory cell array in a flash memory system that manages the erase count as described above. Referring to FIG. 2, when a controller or a flash controller included in the flash memory system receives an erase command in operation 101, the flash controller addresses a block requested to be erased based on address information (which indicates a position of a block to be erased) included in the erase command in operation 103. Overhead data is read from a spare array of the block in operation 105 and is stored in a register in operation 107, and the block is erased in operation 109. The overhead data stored in the register is updated and written to the spare array of the erased block in operation 111. The result of the erase operation, i.e., erase status is sent to a host in operation 113.

However, program disturbance occurs at cells in a data area when the updated overhead data is written in operation 111, thereby increasing the number of partial program cycles (NOP) by 1. Here, the NOP is the number of times that cells connected with a single page can be programmed without an erase operation when the cells are programmed in units of a predetermined number of bytes. Accordingly, when the NOP increases, the life and performance of the non-volatile memory system decreases.

FIGS. 3A through 3D are graphs of cell distributions at different stages in a conventional method of erasing a block in a non-volatile memory device. FIG. 3A illustrates cell distributions in a main array and a spare array when the block is erased in operation 109 illustrated in FIG. 2. FIG. 3B illustrates the change in the cell distribution in the main array when a post-program operation is performed after operation 109. FIG. 3C illustrates the change in the cell distribution in the spare array when the overhead data is written in operation 111 illustrated in FIG. 2. FIG. 3D illustrates the change in the cell distribution in the main array when the overhead data is written in operation 111.

After the block is erased in operation 109, cells in the main array of the block and cells in the spare array of the block are distributed in the same range of threshold voltage Vth (V) as illustrated in FIG. 3A. After the post-program operation is performed with respect to the cells in the main array of the erased block after operation 109 although now shown in FIG. 2, the cells in the main array are distributed in the range of threshold voltage Vth, which is a little higher and narrower than the threshold voltage range illustrated in FIG. 3A, as illustrated in FIG. 3B. After the updated overhead data is written to the spare array in operation 111, the cells in the spare array are distributed in a changed threshold voltage range as illustrated in FIG. 3C. After the updated overhead data is written to the spare array in operation 111, the cells in the main array are influenced by a program voltage applied to the spare array and are distributed as illustrated in FIG. 3D. At this time, program disturbance occurs in cells distributed in a threshold voltage range Pd1 (e.g., the cells adjacent to the spare array 13 in FIG. 1). In other words, when overhead data is written to the spare array, program disturbance occurs in the cells distributed in the threshold voltage range Pd1, and therefore, the NOP of a current page is increased by 1, which may cause the life and the performance of the non-volatile memory device to be degraded.

SUMMARY OF THE INVENTION

Embodiments of the present invention include methods of operating non-volatile memory devices that compensate for threshold voltage disturbances caused by overhead data programming during block erase operations. Methods of operating non-volatile memory devices according to some embodiments of the invention include erasing a spare array of nonvolatile memory cells and a corresponding main array of nonvolatile memory cells that shares word lines with the spare array. This erasing operation is followed by writing updated overhead data (e.g., an erase count) into the spare array and then performing a soft program operation. This soft program operation is performed on at least a first portion of the main array to thereby narrow a threshold voltage distribution of erased memory cells within the first portion of the main array. The soft program operation is then followed by an operation to verify an erased status of at least the first portion of the main array and an operation to communicate that the main and spare arrays of nonvolatile memory cells have been properly erased to a memory controller. The initial operations to erase the spare and main arrays of nonvolatile memory cells may also be preceded by an operation to read overhead data from the spare array and update the value of the overhead data. For example, in the event the overhead data includes a count of the number of erase cycles experienced by the main and spare arrays, then the count may be incremented and temporarily stored (e.g., in a register) in advance of writing the incremented count into the spare array.

The operation to soft program at least a first portion of the main array may include an operation to soft program a first string of non-volatile memory cells in the main array. This first string of memory cells may extend immediately adjacent a string of spare memory cells in the spare array. In some alternative embodiments of the invention, the operation to soft program may include soft programming a block of memory cells in the main array. Moreover, the operation to soft program the first string may include driving at least a plurality of immediately adjacent word lines in the first string of memory cells with a post-program voltage (Vpgmp) having a magnitude in a range between a pass voltage (Vpass) and a program voltage (Vpgm) associated with a normal program/writing operation (i.e., Vpass<Vpgmp<Vpgm). In particular, all active word lines in the first string of memory cells may be driven with a post-program voltage having a magnitude in a range between the pass voltage and the program voltage during the soft program operation.

Methods of operating non-volatile memory devices according to additional embodiments of the invention include erasing a spare array of nonvolatile memory cells and a corresponding main array of nonvolatile memory cells that shares word lines with the spare array and then programming a portion of the spare array by writing updated overhead data into a row of the spare array. These steps are followed by operations to narrow a threshold voltage distribution of a plurality of erased cells in the main array that had their threshold voltages changed by the writing of updated overhead data into the row of the spare array.

BRIEF DESCRIPTION OF THE DRAWINGS

The above and other features and advantages of the present invention will become more apparent by describing in detail exemplary embodiments thereof with reference to the attached drawings in which:

FIG. 6B is a graph illustrating the change in cell distributions in the main array and the spare array when overhead data is written in the method illustrated in FIG. 5.

DETAILED DESCRIPTION OF THE INVENTION

Figure 1:
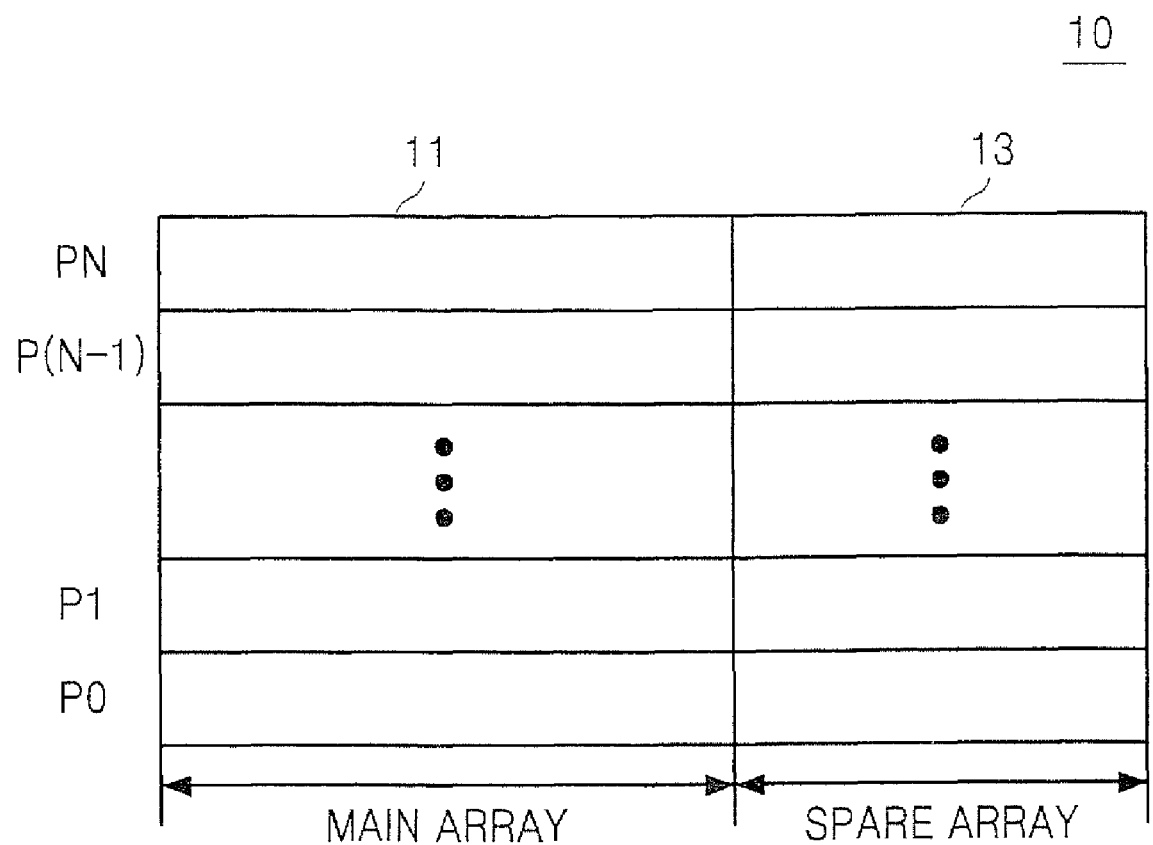
FIG. 1 illustrates a conventional logical structure of a memory cell array.
Figure 2:
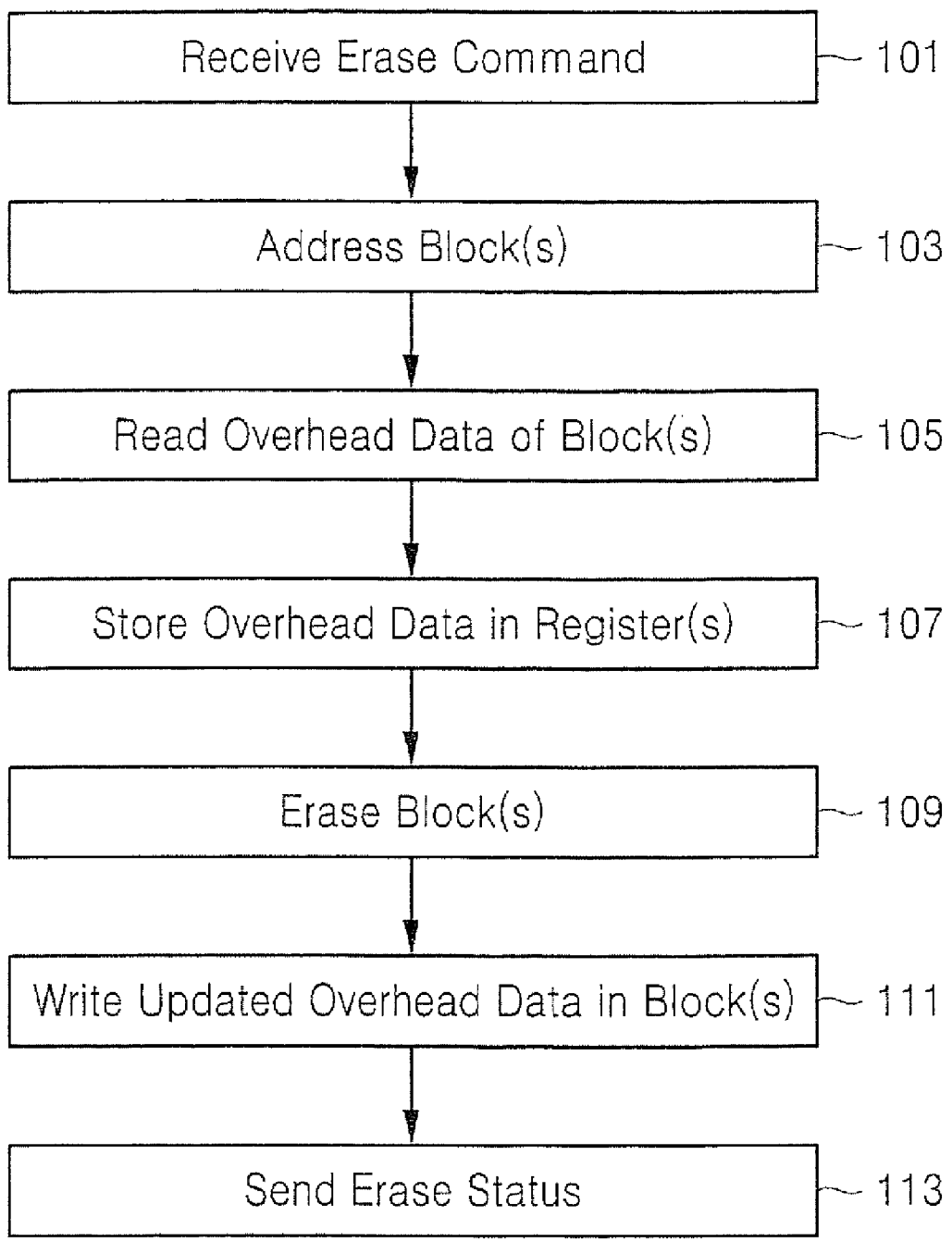
FIG. 2 is a flowchart of a conventional method of erasing a block in a non-volatile memory device.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 3:
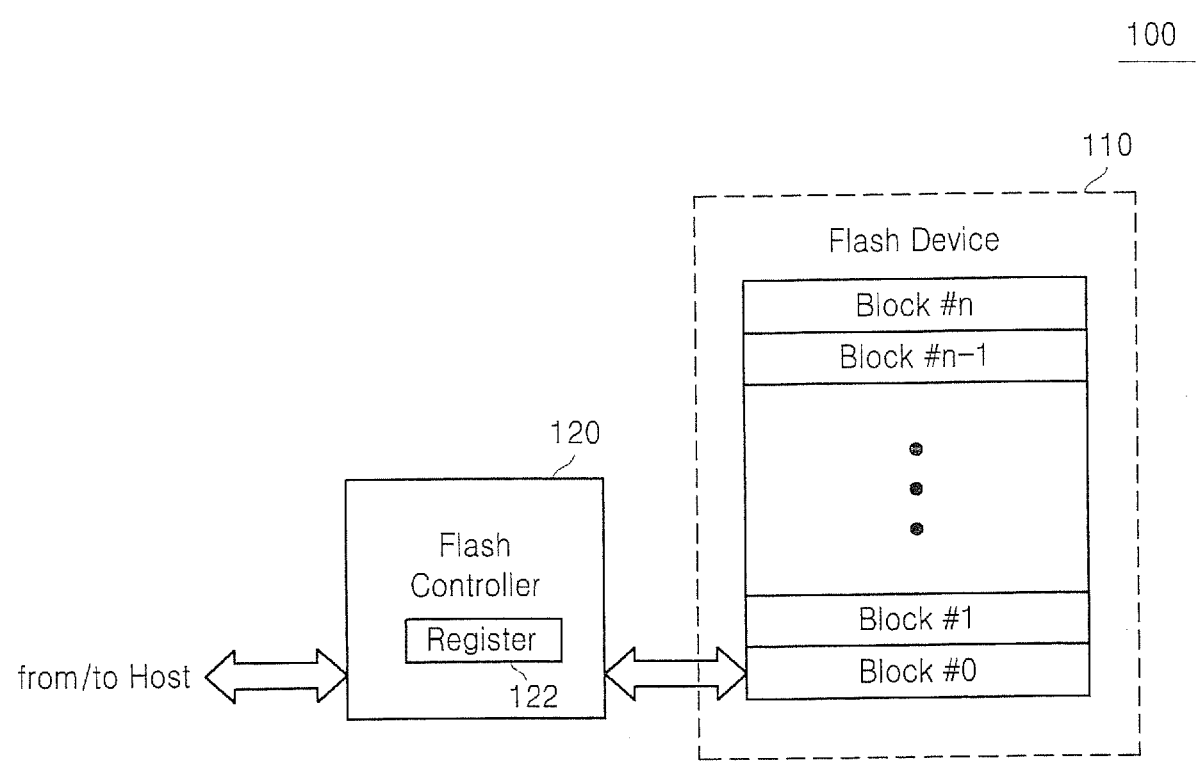
FIG. 3 is a schematic block diagram of a non-volatile memory system according to some embodiments of the present invention.

FIG. 3 is a schematic block diagram of a non-volatile memory system 100 according to some embodiments of the present invention. The non-volatile memory system 100 includes a flash device 110 for storing data and a flash controller 120 for controlling the flash device 110.

Figure 4:
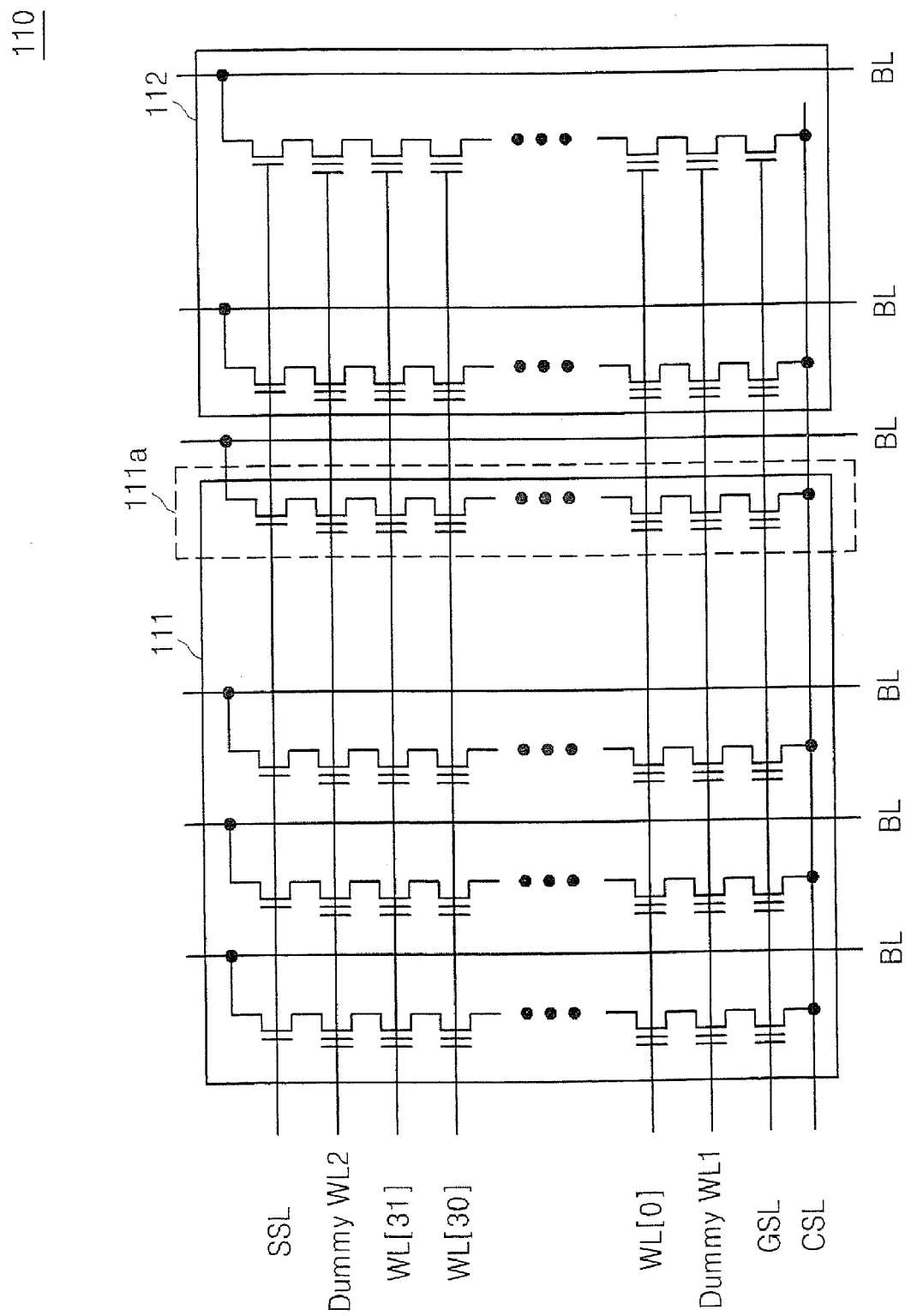
FIG. 4 illustrates the structure of a memory block included in the non-volatile memory system illustrated in FIG. 3.

The flash device 110 includes a plurality of memory blocks Block#0 through Block#n each including a plurality of memory cells. The flash device 110 programs, erases, or reads data according to a command received from the flash controller 120. An example of the structure of each memory block is illustrated in FIG. 4. Particularly, FIG. 4 shows the structure of a memory block in a NAND flash memory system. Referring to FIG. 4, the memory block includes a main array 111 for storing user data and header information and a spare array 112 for replacing a bad portion in the main array 111.

The flash controller 120 sends a program, erase or read command to the flash device 110 based on a command and an address that are received from a host. In particular, the flash controller 120 temporarily stores overhead data stored in the spare array 112 of a certain block in response to the erase command, updates the overhead data after the block is erased, and then writes the updated overhead data to the spare array 112 of the certain block. The overhead data may be temporarily stored in a register 122 included in the flash controller 120.

When the updated overhead data is written to the spare array 112 of the erased block, program inhibition may not be perfectly accomplished at memory cells in the main array 111. Especially, memory cells 111a adjacent to the spare array 112 in the main array 111 may be disturbed more by coupling noise between bits. Accordingly, program disturbance tends to easily occur in the memory cells 111a. To prevent such program disturbance in the memory cells 111a, the flash controller 120 applies a post-program voltage to the memory cells 111a of the main array 111 after writing the updated overhead data to the spare array 112 of the erased block.

A post-program operation is a process of increasing threshold voltages of "over-erased cells (cells whose threshold voltages are excessively lowered)" occurring when a flash memory system uses the same erase time for all cells having different erase times while erasing each block, so that the threshold voltages of the memory cells in the block are within a predetermined range. In addition, the post-program operation enables the threshold voltages of all memory cells to approximate to an erase verify voltage, so that a channel-off state can be easily obtained during a local boosting program operation. This post-program operation is usually performed with respect to erased blocks.

The flash controller 120 performs the post-program operation after writing updated overhead data to the spare array 112 to shift the threshold voltages of memory cells, which have been out of a normal range due to the influence of a program voltage for writing the updated overhead data, to the normal range, thereby preventing program disturbance from occurring in the cells in the main array 111 while the updated overhead data is being written to the spare array 112. The above-described operations and cell distributions appearing after the operations will be described in detail with reference to FIG. 5 and FIGS. 6A through 6C.

Figure 5:
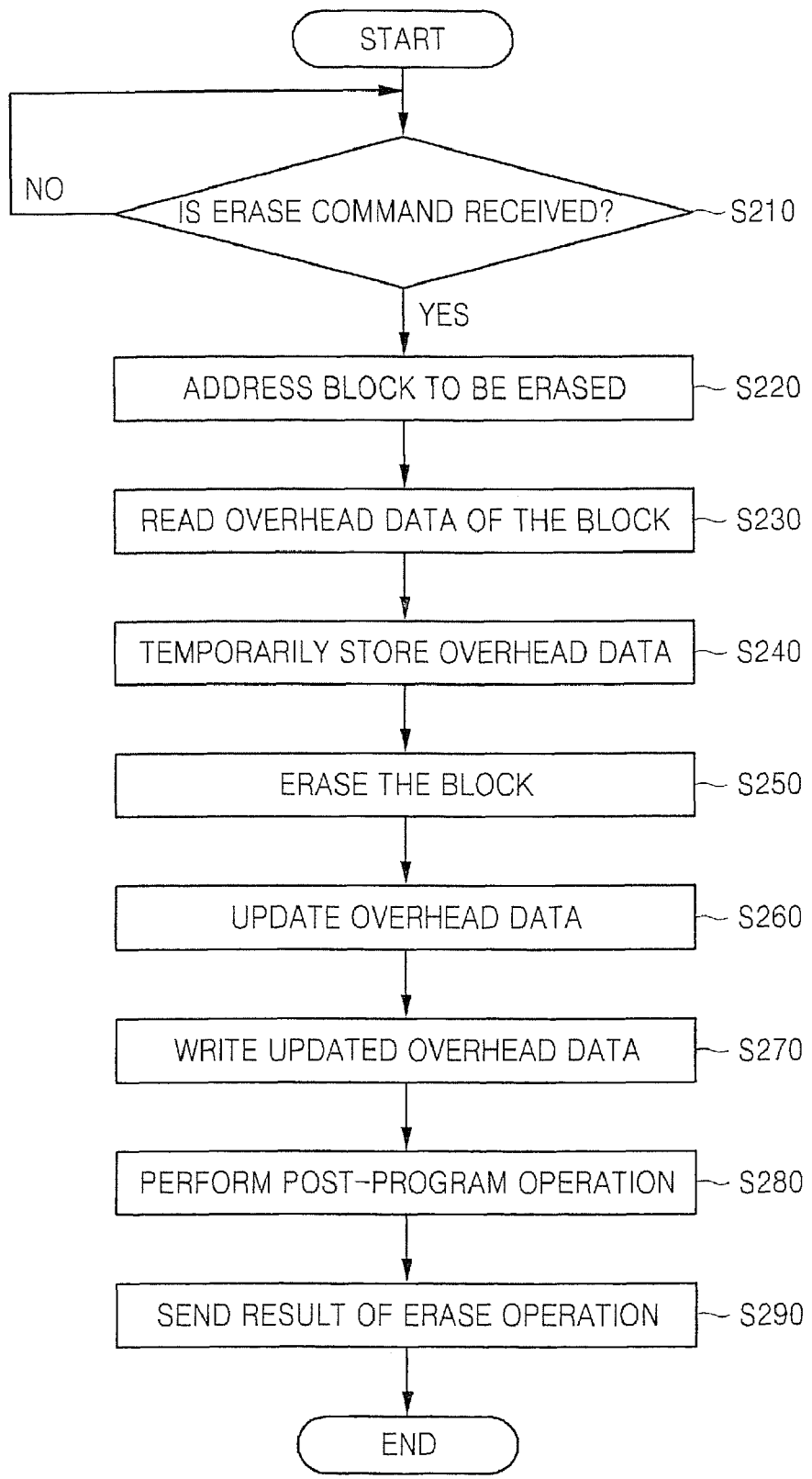
FIG. 5 is a flowchart of a method of erasing a block in a non-volatile memory device according to some embodiments of the present invention.

FIG. 5 is a flowchart of a method of erasing a block in a non-volatile memory device according to some embodiments of the present invention. Referring to FIGS. 3 and 5, the non-volatile memory system 100 including the non-volatile memory device erases a block of the non-volatile memory device as follows.

When receiving an erase command from a host in operation S210, the flash controller 120 addresses a block to be erased based on address information (indicating a position of the block to be erased) included in the erase command in operation S220. Next, the flash controller 120 reads overhead data (e.g., an erase count) from a spare array of the block in operation S230, temporarily stores the overhead data in operation S240, and erases the block in operation S250. At this time, the overhead data may be stored in the register 122 included in the flash controller 120.

Thereafter, the flash controller 120 reads the temporarily stored overhead data and updates the overhead data in operation S260 and writes the updated overhead data to the spare array of the erased block in operation S270. Through operations S260 and S270, the flash controller 120 increases the erase count by 1 and writes the increased erase count to the spare array of the erased block. At this time, the erase count is increased by 1 because the erase count indicates the number of erase operations performed on the block.

As mentioned in the above description of FIG. 3, when the overhead data is written to the spare array of the erased block in operation S270, program disturbance may occur in cells included in a main array of the block because the cells are influenced by a program voltage applied to the spare array. In order to eliminate the program disturbance in some embodiments of the present invention, the flash controller 120 performs a post-program operation on the cells in the main array in operation S280 after the overhead data is written to the spare array. The post-program operation has been described in detail with reference to FIGS. 4 and 6 above.

The post-program operation is included in a normal erase operation and is usually performed immediately after the block is erased to restore over-erased cells. However, in some embodiments of the present invention, the post-program operation is performed after the erase count is written in operation S270 to eliminate program disturbance occurring in operation S270. Thereafter, the flash controller 120 sends a result of the erase operation to the host in operation S290.

In the above-described method, the program disturbance occurring when the erase count is written to the spare array is eliminated by performing the post-program operation in operation S280, so that the program disturbance can be minimized and the increase of the number of partial program cycles (NOP) can be prevented.

Figure 6A:
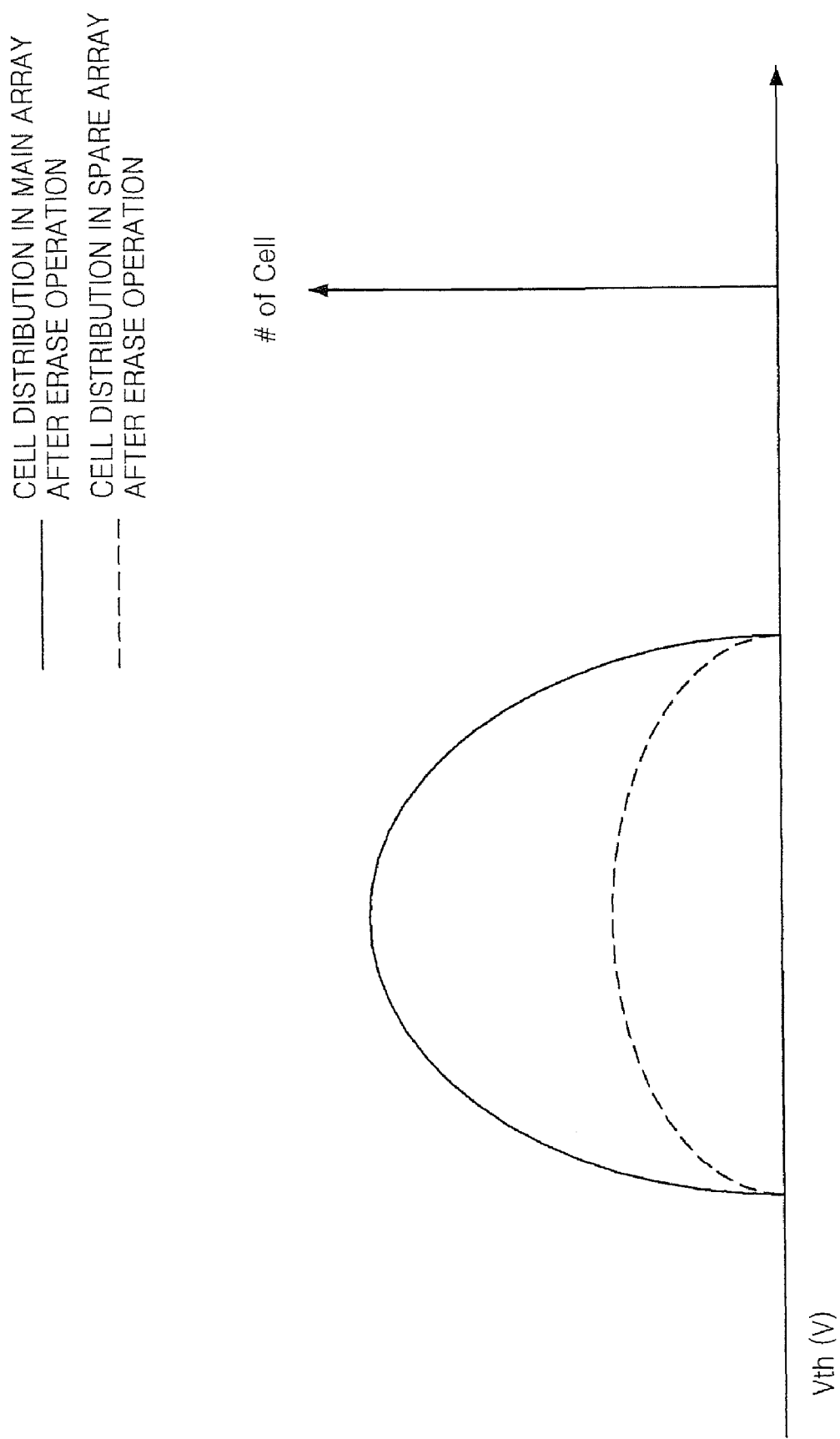
FIG. 6A is a graph illustrating cell distributions in a main array and a spare array when a block is erased in the method illustrated in FIG. 5.
Figure 6C:
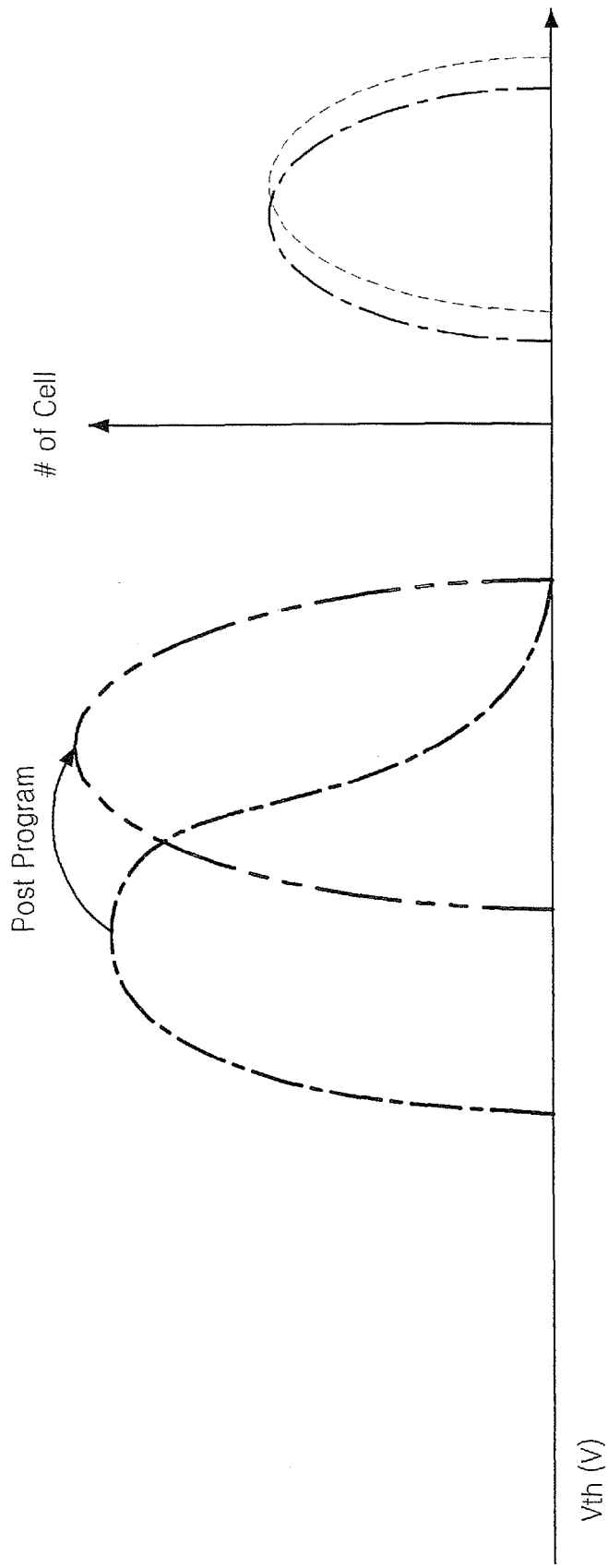
FIG. 6C is a graph illustrating the change in cell distributions in the main array and the spare array when a post-program operation is performed in the method illustrated in FIG. 5.

FIGS. 7A through 7C are graphs illustrating cell distribution in different stages of the method illustrated in FIG. 5. FIG. 6A is a graph illustrating cell distributions in the main array and the spare array when the block is erased in operation S250 illustrated in FIG. 5. FIG. 6B is a graph illustrating the change in the cell distributions in the main array and the spare array when the overhead data is written in operation S270 illustrated in FIG. 5. FIG. 6C is a graph illustrating the change in the cell distributions in the main array and the spare array when the post-program operation is performed in operation S280 illustrated in FIG. 5.

After the block is erased in operation S250 in FIG. 5, the cells in the main array of the block and the cells in the spare array of the block are distributed in the same range of threshold voltage Vth (V) as illustrated in FIG. 6A.

After the updated erase count is written to the spare array in operation S270, the cells in the spare array are distributed in a partially changed range of higher threshold voltage as illustrated in FIG. 6B. Meanwhile, the cells in the spare array is distributed in an entirely changed range of higher threshold voltage as illustrated in FIG. 6B due to the influence of a program voltage applied to the spare array when the updated erase count is written to the spare array in operation S270. At this time, program disturbance occurs in cells distributed in a range Pd2. However, a program disturbance area can be compensated for by the post-program operation as illustrated in FIG. 6C.

Referring to FIG. 6C, after the post-program operation is performed on the cells included in the main array of the erased block in operation S280 illustrated in FIG. 5, the cells in the main array are distributed within a predetermined range of threshold voltage without the program disturbance area. Meanwhile, after the post-program operation, the cells in the spare array have a little increased threshold voltages due to the influence of a post-program voltage applied to the main array. At this time, the post-program voltage is about 12 V and is lower than a program voltage of about 20 V. Accordingly, the cells in the spare array having their threshold voltages increased a lot as illustrated in FIG. 6B are less influenced by the post-program voltage than the cells in the main array. Such small increase in the threshold voltages of the cells in the spare array as illustrated in FIG. 6C can be ignored.

Accordingly, as described herein, methods of operating non-volatile memory devices according to embodiments of the present invention compensate for threshold voltage disturbances caused by overhead data programming during block erase operations. As illustrated by FIGS. 3-5, these methods include erasing a spare array of nonvolatile memory cells 112 and a corresponding main array of nonvolatile memory cells 111 that shares word lines with the spare array 112, Block S250. This erasing operation is followed by writing updated overhead data (e.g., an erase count) into the spare array 112 and then performing a soft program operation, Blocks S270 and S280. This soft program operation is performed on at least a first portion of the main array 111 to thereby narrow a threshold voltage distribution of erased memory cells within the first portion of the main array 111. The soft program operation, Block S280, is then followed by an operation to verify an erased status of at least the first portion of the main array and an operation to communicate that the main and spare arrays of nonvolatile memory cells have been properly erased to a memory controller 120, Block S290. The initial operations to erase the spare and main arrays of nonvolatile memory cells may also be preceded by an operation to read overhead data from the spare array and update the value of the overhead data, Blocks S230-S240 and S260. For example, in the event the overhead data includes a count of the number of erase cycles experienced by the main and spare arrays 111 and 112, then the count may be incremented and temporarily stored (e.g., in a register) in advance of writing the incremented count into the spare array 112.

The writing operation may include an operation to drive a selected word line extending across the main and spare arrays 111 and 112 with the program voltage (Vpgm) concurrently with driving a plurality of unselected word lines extending across the main and spare arrays 111 and 112 with the pass voltage (Vpass).

The operation to soft program at least a first portion of the main array 111 may include an operation to soft program a first string of non-volatile memory cells in the main array 111. This first string of memory cells may extend immediately adjacent a string of spare memory cells in the spare array 112. In some alternative embodiments of the invention, the operation to soft program may include soft programming a block of memory cells in the main array 111. Moreover, the operation to soft program the first string may include driving at least a plurality of immediately adjacent word lines in the first string of memory cells with a post-program voltage (Vpgmp) having a magnitude in a range between a pass voltage (Vpass) and a program voltage (Vpgm) associated with a normal program/writing operation (i.e., Vpass<Vpgmp<Vpgm). In particular, all active word lines (WL0-WL31) in the first string of memory cells may be driven with a post-program voltage having a magnitude in a range between the pass voltage and the program voltage during the soft program operation. The operation to soft program at least a first portion of the main array 111 may include an operation to soft program a corresponding row of the main array 111 that shares word line with a row of the spare array 112 which the updated overhead data is written into.

Methods of operating non-volatile memory devices according to additional embodiments of the invention include erasing a spare array of nonvolatile memory cells 112 and a corresponding main array of nonvolatile memory cells 111 that shares word lines with the spare array 112 and then programming a portion of the spare array 112 by writing updated overhead data into a row of the spare array 112. These steps are followed by operations (e.g., soft programming operations) to narrow a threshold voltage distribution of a plurality of erased cells in the main array 111 that had their threshold voltages changed by the writing of updated overhead data into the row of the spare array 112.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of operating a non-volatile memory device, comprising:
   erasing a spare array of nonvolatile memory cells and a corresponding main array of nonvolatile memory cells that shares word lines with the spare array;
   writing updated overhead data into the spare array; and then
   performing a soft program operation on at least a first portion of the main array to thereby narrow a threshold voltage distribution of erased memory cells within the first portion of the main array.

2. The method of claim 1, wherein said performing a soft program operation is followed by verifying an erased status of at least the first portion of the main array.

3. The method of claim 1, wherein said erasing is preceded by reading overhead data from the spare array.

4. The method of claim 1, wherein said performing a soft program operation comprises soft programming a first string of non-volatile memory cells in the main array.

5. The method of claim 4, wherein the first string of memory cells extends immediately adjacent a string of spare memory cells in the spare array.

6. The method of claim 1, wherein said performing a soft program operation comprises soft programming a block of memory cells in the main array.

7. The method of claim 4, wherein said performing a soft program operation comprises driving a plurality of immediately adjacent word lines in the first string of memory cells with a post-program voltage having a magnitude in a range between a pass voltage and a program voltage associated with a normal writing operation.

8. The method of claim 7, wherein said writing comprises driving a selected word line extending across the main and spare arrays with the program voltage concurrently with driving a plurality of unselected word lines extending across the main and spare arrays with the pass voltage.

9. The method of claim 4, wherein said performing a soft program operation comprises driving all active word lines in the first string of memory cells with a post-program voltage having a magnitude in a range between a pass voltage and a program voltage associated with a normal writing operation.

10. The method of claim 1, wherein said performing a soft program operation comprises soft programming a row of the main array that shares word line with a row of the spare array which the updated overhead data is written into.

11. A method of operating a non-volatile memory device, comprising:
 erasing a spare array of nonvolatile memory cells and a corresponding main array of nonvolatile memory cells that shares word lines with the spare array;
 programming a portion of the spare array by writing updated overhead data into a row of the spare array; and then
 narrowing a threshold voltage distribution of a plurality of erased cells in the main array that had their threshold voltages changed by the writing of updated overhead data into the row of the spare array.

12. A method of erasing a block of a non-volatile memory device including a plurality of memory blocks each including a main array and a spare array, the method comprising:
 addressing a block to be erased based on an erase command and an address, which are received from a host;
 reading overhead data from a spare array of the block and temporarily storing the overhead data in another space;
 erasing cells of the block;
 updating the temporarily stored overhead data and writing the updated overhead data to the spare array; and
 eliminating program disturbance occurring in a main array of the erased block when the updated overhead data is written to the spare array.

13. The method of claim 12, wherein the eliminating the program disturbance comprises applying a control voltage to cells included in the main array to distribute threshold voltages of the cells included in the main array within a predetermined threshold voltage range.

14. The method of claim 13, wherein the control voltage applied to the cells included in the main array is a post-program voltage.

15. The method of claim 12, wherein the overhead data comprises an erase count.

* * * * *